(12) United States Patent
Pang

(10) Patent No.: US 6,477,658 B1
(45) Date of Patent: Nov. 5, 2002

(54) MICROPROCESSOR WITH VARIABLE CLOCK OPERATION

(75) Inventor: Dae Sung Pang, Seoul (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/342,911

(22) Filed: Jun. 30, 1999

(30) Foreign Application Priority Data

Oct. 19, 1998 (KR) .............................................. 98/43680

(51) Int. Cl.[7] .................................................. G06F 1/08
(52) U.S. Cl. ....................................................... 713/501
(58) Field of Search ................................... 713/501, 500

(56) References Cited

U.S. PATENT DOCUMENTS

| | | | |
|---|---|---|---|
| 5,412,349 A | 5/1995 | Young et al. | 331/34 |
| 5,548,679 A | 8/1996 | Kiyota | 388/811 |
| 5,991,888 A * | 11/1999 | Faulkner et al. | 713/501 |
| 6,127,858 A * | 10/2000 | Stinson et al. | 327/99 |

* cited by examiner

*Primary Examiner*—Thomas M. Heckler
(74) *Attorney, Agent, or Firm*—Fleshner & Kim, LLP

(57) ABSTRACT

A microprocessor with a variable clock operation, which is operative at a highest speed as well as a lowest speed, within a maximum performance range of the microprocessor is disclosed. The invention includes a microprocessor having a Critical Path Operation (CPO) block that is operative at a speed corresponding to an external clock signal; a decision circuit for deciding an operation state of the microprocessor, according to a test result of the CPO block in the microprocessor; a MUX unit for selecting a signal from either a signal from the decision circuit or an external signal, selecting a signal intended to control, and forwarding the selected signal; a controlling unit for receiving a signal from the MUX unit for providing a control signal for varying a clock signal; and a PLL circuit for varying the clock signal in response to the control signal from the controlling unit for applying a varied clock signal to the microprocessor.

12 Claims, 3 Drawing Sheets

MICROPROCESSOR WITH VARIABLE CLOCK OPERATION

BACKGROUND OF THE INVENTION

1. Field of the Invention

The present invention relates to a microprocessor and, more particularly, to a microprocessor with a variable clock operation that is operative at both a highest speed as well as a lowest speed, within a performance range of the microprocessor.

2. Background of the Related Art

Though microcomputers are different from each other in view of the systems they support, all of them have a microprocessor. As the microprocessor determines the capabilities of the microcomputer, the microprocessor is perhaps the most critical component of the microcomputer. The operational speed of the microprocessor determines a maximum speed of the microcomputer, and its address and data pins determine a memory size and a word size of the microcomputer. The microprocessor's control pins determine the form of input/output (I/O) interfacing to be used. The aforementioned microprocessor has the following variety of functions. That is, the microprocessor provides timing and control signals to all parts of the microcomputer, fetches instructions and data from memories, transmits data to/from I/Os, interprets instructions, performs the calculations and logical operations required by the instructions, and responds to control signals generated from I/O signals, such as a reset or interrupt. A related art microprocessor will be explained with reference to the attached drawings.

FIG. 1 illustrates a related art microprocessor, schematically. The related art microprocessor 10 derives its operational speed from an external and constant main clock. For example, when an external clock of 100 MHz is applied to microprocessor 10, to determine the operational condition of the microprocessor, the microprocessor is given a passing grade if it functions properly and a failing grade if it doesn't, thereby determining an operational speed of the microprocessor. That is, if microprocessor 10 functions properly when a given main clock is applied to it, the frequency of the clock indicates a proper operational speed of microprocessor 10. However, the maximum operational speed of microprocessor 10 speed is not identified by this test.

Therefore, the related art microprocessor has the following problems.

That is, the operational speed of a microprocessor is fixed by a constant main clock, and the maximum operational speed of the microprocessor may not be achieved unless the main clock happens to operate at the maximum frequency for the particular microprocessor.

SUMMARY OF THE INVENTION

Accordingly, the present invention is directed to a microprocessor with a variable clock operation that substantially obviates one or more of the problems due to limitations and disadvantages of the related art.

An object of the present invention is to provide a microprocessor with a variable clock operation that facilitates use of a maximum operational speed and a lowest operational speed within the operational range.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the microprocessor with a variable clock operation includes a microprocessor having a critical path operation (CPO) block that is adapted to be operative at a speed corresponding to an external clock signal; a decision circuit for deciding an operation state of the microprocessor according to a test result of the CPO block in the microprocessor; a MUX unit for selecting a signal from the decision circuit or an external signal, selecting a signal intended to control, and forwarding the selected signal; a controlling unit for receiving a signal from the MUX unit for providing a control signal for varying a clock signal; and a PLL circuit for varying the clock signal in response to the control signal from the controlling unit, for applying a varied clock signal to the microprocessor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF PREFERRED EMBODIMENTS

Reference will now be made in detail to the preferred embodiments of the present invention, examples of which are illustrated in the accompanying drawings.

Figure 1:
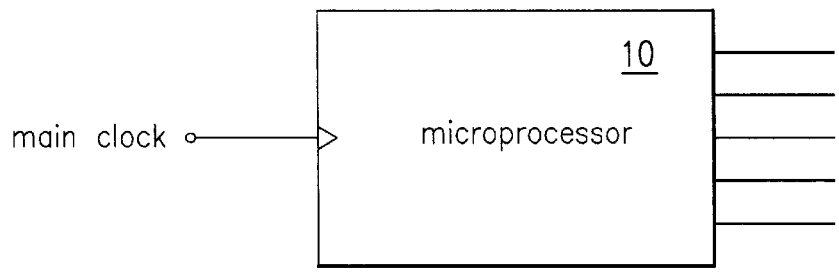
FIG. 1 illustrates a related art microprocessor, schematically.
Figure 2:
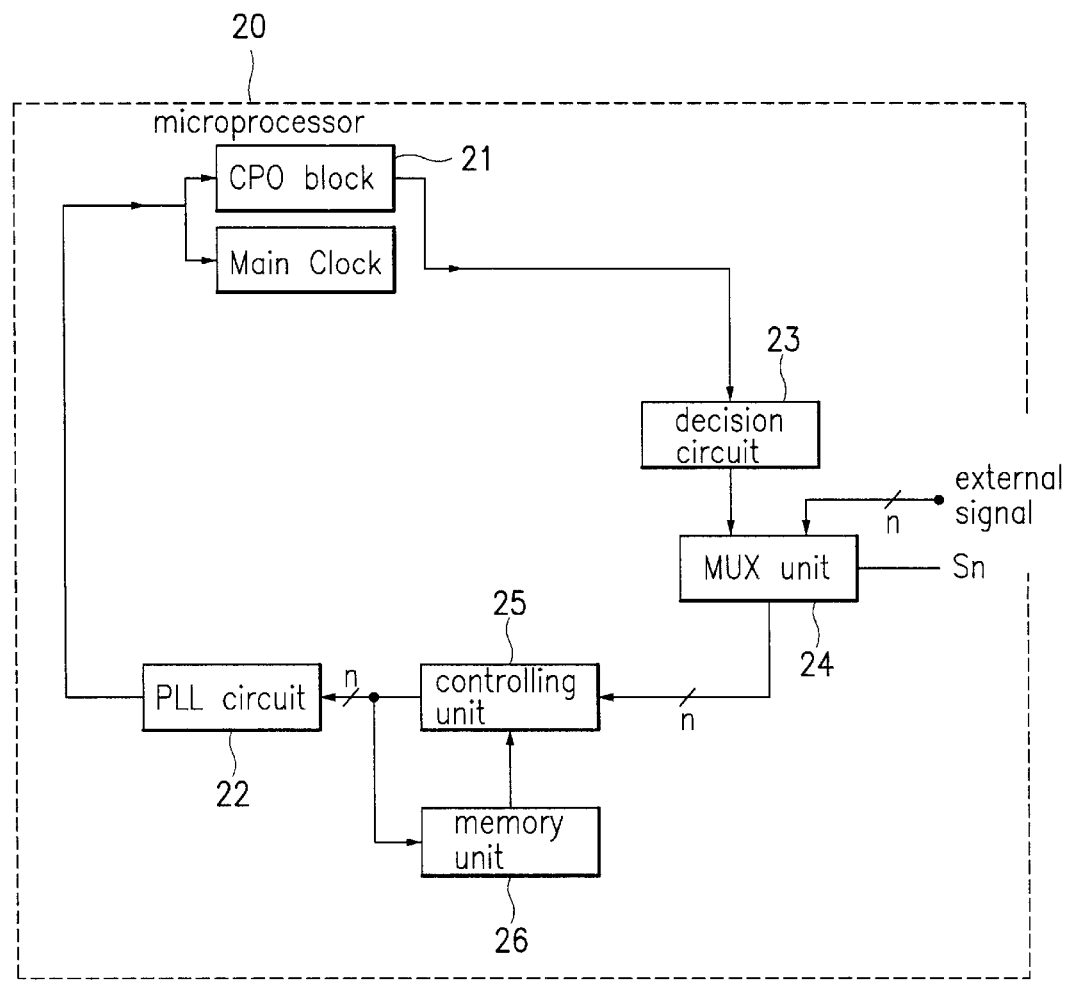
FIG. 2 illustrates a block diagram of a microprocessor with a variable clock operation in accordance with a preferred embodiment of the present invention.

FIG. 2 illustrates a block diagram of a microprocessor with a variable clock operation, in accordance with a preferred embodiment of the present invention. FIG. 2 illustrates a microprocessor 20 having a Critical Path Operation (CPO) block 21 that is operative at a speed corresponding to an external clock signal; a decision circuit 23 for receiving a signal from the CPO block 21 that is used to determine a maximum operational speed of the microprocessor 20; a multiplexer (MUX) unit 24 for receiving either a signal from the decision circuit 23 or an external n-bit signal, selecting a signal intended to control, and forwarding the selected signal; a controlling unit 25 for receiving a signal from the MUX unit 24 and providing a control signal to vary a clock signal; and a Phase Locked Loop (PLL) circuit 22 for varying the clock signal in response to the control signal from controlling unit 25 and applying the variable clock signal for controlling the operating speed of the microprocessor to microprocessor 20, thereby forming a control loop.

The operational speed of the microprocessor 20 is fixed by a clock provided by PLL circuit 22. N bits of data from controlling unit 25 may be stored in an external memory unit 26 of a Random Access Memory (AM) or a storage register and later applied to controlling unit 25. The data stored in memory unit 26 may be read or written, externally.

Microprocessor 20 is provided with an adequate operational speed margin, above its rated maximum operational speed, by simulating CPO block 21 and applying the simulation results to the design of the microprocessor. However, microprocessor 20 may show an operational speed different from the simulation in a test performed after the design, particularly when there are design changes. For example, a microprocessor designed with an operational speed of 100 MHz may be operative at 150 MHz, after fabrication.

Utilizing this characteristic, CPO block 21 is provided in microprocessor 20 to provide a signal corresponding to the time period of a prescribed microprocessor 20 operation. In the test conducted by the CPO block 21, no separate hardware for the test is required, but repeated test operations by the microprocessor 20 including fetching, decoding, execution, memory, and read/write of data and instructions are conducted using the external memory unit 26 at a main clock cycle. The speed of the slowest operation of the tests is provided to the decision circuit 23, so that the decision circuit 23 may determine the test result as either pass or fail, i.e, a successfully completed microprocessor 20 operation or a failed microprocessor 20 operation. Thereafter, an UP pulse is provided to controlling unit 25, if CPO block 21 does not fail (i.e., passes). Upon receiving the UP pulse from decision circuit 23, controlling unit 25 provides a control signal (i.e., a driver data from a programmable counter) to PLL circuit 22, and PLL circuit 22 increases the clock frequency in response to the received control signal. The aforementioned operation or test cycle is repeated until the CPO block 21 shows a malfunction or failed microprocessor 20 operation (i.e., fails when the decision circuit 23 provides a DOWN pulse to the loop), so that the control loop goes back to a previous successful clock frequency.

On a successful run of the test cycle, the clock frequency that passes the test is stored in memory unit 26, which only controlling unit 25 accesses from outside. The highest stored frequency value is used to provide a clock signal to microprocessor 20, thereby obtaining a microprocessor that is operative at its maximum speed. MUX unit 24 passes data from decision circuit 23 to controlling unit 25 or passes n-bit data from an external source to controlling unit 25 in accordance with the signal from the decision circuit 23.

Figure 3:
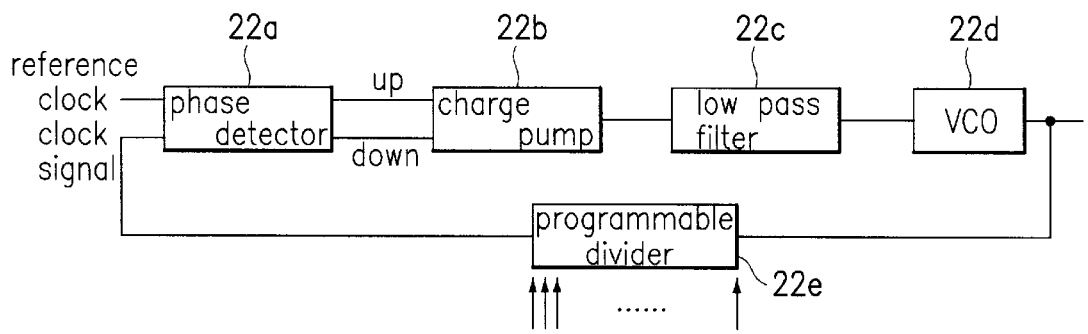
FIG. 3 illustrates a block diagram of the PLL circuit in FIG. 2.

FIG. 3 illustrates a block diagram of the PLL circuit shown in FIG. 2. PLL circuit 22 includes a phase detector 22a for comparing phases of a reference clock with a clock signal and providing an UP/DOWN signal based on a phase difference; a charge pump 22b for receiving the UP/DOWN signal from phase detector 22a and converting the UP/DOWN signal into an analog signal; a low pass filter 22c for receiving the analog signal from charge pump 22b and removing a high frequency component to provide a control voltage; a Voltage Controlled Oscillator (VCO) for receiving the control voltage from low pass filter 22 and varying an operational frequency of the oscillator to provide a varied clock signal; and a programmable divider 22e for dividing a clock signal output from VCO 22d programmatically and forwarding the divided clock signal to phase detector 22a.

Thus, in the aforementioned PLL circuit 22, a phase difference of a reference clock and a clock signal are detected in phase detector 22a to provide an UP/DOWN signal. The UP/DOWN signal from phase detector 22a is converted into an analog value and applied as a control voltage to VCO 22d, after passing through low pass filter 22c. The control voltage changes the frequency of VCO 22d, to provide a clock signal. That is, if the clock signal is slower than the reference clock, an UP signal is generated. The UP signal boosts a control voltage, which makes the clock signal faster, so that it may catch up to the reference clock and vice versa.

Figure 4:
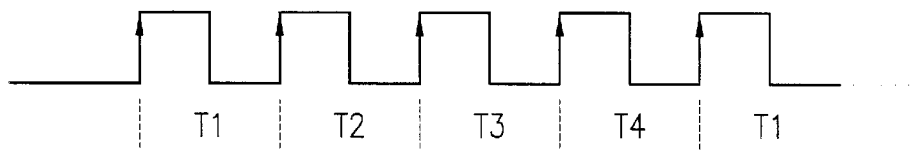
FIG. 4 illustrates a timing diagram showing a clock state of a main CPU.

The system and operation of the decision circuit 23 will be explained below. FIG. 4 illustrates a timing diagram showing a clock state of a main CPU. A critical path is defined as the path that requires the longest time period for the microprocessor 20 to complete. T1 denotes an instruction or data fetch, T2 denotes a decoding operation, T3 denotes an execution operation, and T4 denotes a memory access. For example, suppose the memory access requires 9 ns, the execution operation requires 8 ns, the decoding operation requires 6 ns, and the instruction or data fetch requires 6 ns. The critical path falls on period T4, which is the memory access period, when the event periods T1, T2, T3, and T4 are each 10 ns. And, once the memory access is passed, the microprocessor 20 is operative in a regular clock frequency. In designing the microprocessor 20, a gate level may be set to a delay cell level, in order to provide the reset signal to the decision circuit 23 which signals when the microprocessor has completed an operation.

Figure 5:
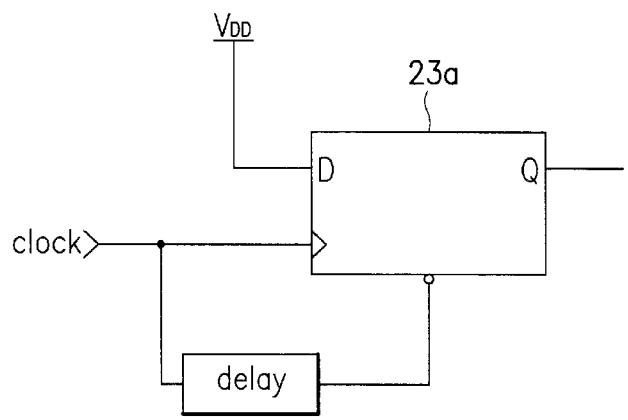
FIG. 5 illustrates a system of the decision circuit in FIG. 2.
Figure 6A:
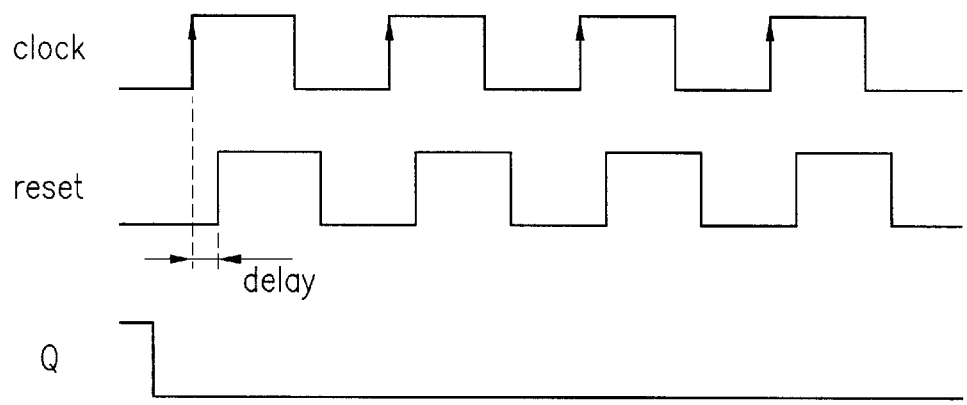
FIG. 6a illustrates a timing diagram showing a critical path in a regular operation of the decision circuit.
Figure 6B:
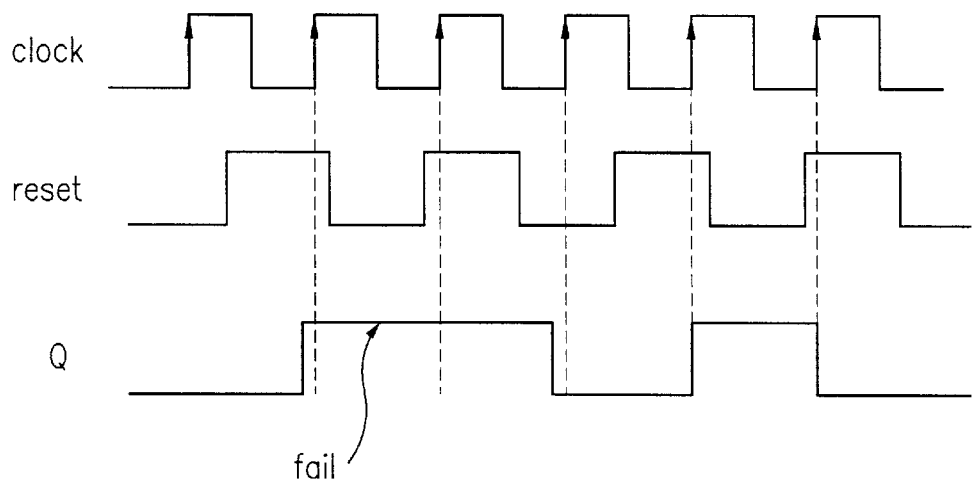
FIG. 6b illustrates a timing diagram of a fail operation of the decision circuit.

FIG. 5 illustrates the decision circuit 23 of FIG. 2 in greater detail. FIG. 6a illustrates a timing diagram showing a critical path in a regular operation of the decision circuit of FIG. 5, and FIG. 6b illustrates a timing diagram of a fail operation of the decision circuit.

Referring to FIG. 5, the decision circuit includes a D-flipflop 23a for receiving an external clock signal from the CPO block 21 and a reset signal received from the microprocessor 20 and switching the source voltage $V_{DD}$ to produce an output, Q. A delay 23b delays the clock signal for a time period to reset the D-flipflop 23a after the microprocessor fails a test. As shown in FIG. 6a, if the value of the reset signal is low during the rising transition of the clock signal D-flipflop 23a always provides a low signal. If a regular clock signal is received and the delay 23b is regularly operative, the output signal of D-flipflop 23a is held low. However, if the clock signal received from the CPO block 21 becomes faster, step by step, up to a point at which the critical path cannot be passed through within the clock period, as shown in FIG. 6b, as indicated by the reset signal, D-flipflop 23a provides a high output signal, Q. This high output signal indicates a critical path did not have sufficient time to execute and thus failed (i.e., a failed microprocessor operation), and this indication may be used to identify a maximum range of the critical path.

The microprocessor with a variable clock operation of the present invention, as explained herein, allows a person to find a maximum operational speed, after the design or fabrication of a microprocessor, thereby increasing the data processing amount and rate and lowering the power consumption when the microprocessor is not in use, by holding the clock signal very low.

It will be apparent to those skilled in the art that various modifications and variations can be made in the microprocessor with a variable clock operation of the present invention without departing from the spirit or scope of the invention. Thus, it is intended that the present invention cover the modifications and variations of this invention provided they come within the scope of the appended claims and their equivalents.

What is claimed is:

1. A microprocessor with a variable clock operation cycle, comprising:

a microprocessor comprising a Critical Path Operation (CPO) block configured to conduct at least one microprocessor operation using a current clock signal, wherein the microprocessor is adapted to be operated at a speed corresponding to a controllably variable clock signal, wherein the controllably variable clock signal sets the current clock signal;

a decision circuit configured to receive the current clock signal and an output signal from the CPO to determine an operation completion status of the at least one microprocessor operation;

a controlling unit coupled to the decision circuit and configured to provide a control signal based on the operation completion status of the at least one microprocessor operation; and, a Phase Locked Loop (PLL) circuit configured for varying the controllably variable clock signal received by the microprocessor in accordance with the control signal.

2. A microprocessor as claimed in claim 1, wherein the microprocessor operates faster than its rated operation speed.

3. A microprocessor as claimed in claim 1, wherein a MUX unit is coupled between the decision circuit and the controlling unit and outputs a selection signal received from the decision circuit to the controlling unit or outputs the external control signal, in accordance with the selection signal received from the decision circuit, wherein the selection signal is based on the operation completion status.

4. A microprocessor as claimed in claim 1, wherein the microprocessor operation speed is controlled by a signal from the PLL circuit, and wherein the controllably variable clock signal increases until the control signal indicates a failed operation completion status and the current clock signal is set as a maximum microprocessor clock speed.

5. A microprocessor as claimed in claim 1, wherein a test result of the CPO block is provided to the decision circuit, so that the decision circuit can determine whether the at least one microprocessor operation was a successfully completed microprocessor operation or a failed microprocessor operation, and to provide an UP signal to the controlling unit if the CPO block test result shows the successfully completed microprocessor operation.

6. A microprocessor as claimed in claim 1, wherein when the CPO block shows a failed microprocessor operation, the decision circuit provides a DOWN pulse to the controlling unit so that the controlling unit goes back to a previously stored successful clock speed higher than a rated operation speed for the microprocessor.

7. A microprocessor as claimed in claim 1, wherein the PLL circuit comprises:

a phase detector configured for comparing phases of a reference clock signal and a received clock signal and providing an UP/DOWN signal based on a phase difference there between;

a charge pump configured for receiving the UP/DOWN signal from the phase detector and converting the UP/DOWN signal into a analog signal;

a low pass filter configured for receiving the analog signal from the charge pump and removing a high frequency component therefrom to provide a control voltage;

a Voltage Controlled Oscillator (VCO) configured for receiving the control voltage from the low pass filter, and varying an operation frequency of the VCO to provide a varied clock signal; and a divider configured for generating a first clock signal in accordance with a value, wherein the value is created by dividing a second clock signal from the VCO by a third clock signal and outputting the first clock signal to the phase detector.

8. A microprocessor as claimed in claim 1, wherein the decision circuit comprises:

a D-flipflop connected to a source voltage and configured for receiving an external clock signal and a reset signal and outputting a prescribed voltage in accordance with the external clock signal and the reset signal; and a delay circuit configured for delaying an input signal for a prescribed time period in order to provide the reset signal to the D-flipflop.

9. A microprocessor as claimed in claim 1, wherein the at least one microprocessor operation conducted by the CPO block comprises fetching instructions, decoding instructions, executing instructions, and reading and writing operations to and from a memory that are conducted on an external memory unit.

10. A microprocessor as claimed in claim 9, wherein the external memory unit includes RAM or a register configured to execute memory input/output operations.

11. A microprocessor as claimed in claim 1, wherein when the operation completion status indicates operation complete for the current clock signal then the current clock signal is stored in the external memory unit.

12. A microprocessor as claimed in claim 11, wherein only the controlling unit receives the current clock signal stored in the external memory unit, in order to provide a maximum clock signal to the microprocessor.

* * * * *